United States Patent
Bera et al.

(10) Patent No.: US 7,846,846 B2
(45) Date of Patent: Dec. 7, 2010

(54) METHOD OF PREVENTING ETCH PROFILE BENDING AND BOWING IN HIGH ASPECT RATIO OPENINGS BY TREATING A POLYMER FORMED ON THE OPENING SIDEWALLS

(75) Inventors: Kallol Bera, San Jose, CA (US); Kenny L. Doan, San Jose, CA (US); Stephan Wege, Dresden (DE); Subhash Deshmukh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 627 days.

(21) Appl. No.: 11/861,032

(22) Filed: Sep. 25, 2007

(65) Prior Publication Data

US 2009/0081876 A1    Mar. 26, 2009

(51) Int. Cl.
*H01L 21/302* (2006.01)
(52) U.S. Cl. ............... 438/706; 438/714; 438/724; 438/725
(58) Field of Classification Search .............. None
See application file for complete search history.

(56) References Cited

U.S. PATENT DOCUMENTS

| | | | |
|---|---|---|---|
| 6,187,685 B1 * | 2/2001 | Hopkins et al. | 438/710 |
| 6,475,920 B2 | 11/2002 | Coburn et al. | 438/714 |
| 6,506,674 B2 | 1/2003 | Ikeda et al. | 438/637 |
| 7,682,986 B2 * | 3/2010 | Chi et al. | 438/723 |
| 7,713,430 B2 * | 5/2010 | Wilson | 216/59 |
| 2008/0203056 A1 * | 8/2008 | Wang et al. | 216/67 |

* cited by examiner

*Primary Examiner*—Duy-Vu N Deo
(74) *Attorney, Agent, or Firm*—Law Office of Robert M. Wallace (57) ABSTRACT

High aspect ratio contact openings are etched while preventing bowing or bending of the etch profile by forming a highly conductive thin film on the side wall of each contact opening. The conductivity of the thin film on the side wall is enhanced by ion bombardment carried out periodically during the etch process.

19 Claims, 6 Drawing Sheets

METHOD OF PREVENTING ETCH PROFILE BENDING AND BOWING IN HIGH ASPECT RATIO OPENINGS BY TREATING A POLYMER FORMED ON THE OPENING SIDEWALLS

TECHNICAL FIELD

Embodiments of the present invention pertain to semiconductor device fabrication, and in particular to plasma etch processes employed in semiconductor device fabrication.

BACKGROUND

Microelectronic device fabrication on a semiconductor wafer requires formation of openings through dielectric thin film layers that are adapted to be filled with metal to provide electrical contact between conductors in different layers. The contact openings typically have an aspect ratio (depth-to-diameter ratio) as high as 40:1. As industry standards progress from 65 nm feature sizes to 45 nm to 32 nm feature sizes, the hole diameter of a contact opening may be reduced to about 630 Å, while the required depth is about 24,700 Å. The opening diameter and the opening-to-opening spacing may be about the same (e.g., roughly 630 Å). Because the aspect ratio of each contact opening is so great, it is essential to have a consistent vertical profile of all the openings, in order to maintain the requisite insulator thickness between adjacent openings. The contact opening location pattern and diameter is defined by an aperture in a patterned photoresist layer that is deposited on the wafer surface prior to formation of the openings. Each photoresist aperture defines a contact opening location and diameter. After photoresist deposition, the contact openings are formed by a plasma etch process that is adapted to etch dielectric material through the apertures in the photoresist layer. The plasma etch process employs a fluorocarbon/fluorohydrocarbon gas that produces two types of species in the plasma: etch species having high fluorine-to-carbon content ratio, and polymer species having a high carbon-to-fluorine content ratio. The polymer species accumulates on exposed surfaces of the sidewall of each opening, which enhances etch selectivity and can reduce the tendency of the etch process to widen the opening beyond the diameter established by the photoresist pattern.

Current plasma etch processes have produced consistently good results at larger feature sizes, e.g., 90 nm. Etch profile is controlled by chamber pressure and by RF bias power. Increasing the RF bias power produces straighter and narrower etch profiles by increasing the ion energy and momentum in the vertical direction. Reducing the chamber pressure can have a similar effect by reducing collisions with ions, thereby reducing the number of ions deflected from their nominal vertical trajectory.

As feature size have been reduced to 45 nm and then to 32 nm, two problems have arisen that in many cases degrade the etch profile sufficiently to threaten device failure. One problem, referred to herein as "bowing", is manifested by a widened section of the contact opening near the top of the opening. The diameter of the widened section may be as much as twice the desired hole diameter, increasing the likelihood of partial merging of adjacent openings at the widened section. Another problem, referred to herein as "bending", is manifested by a deflection of the axis of the opening away from true vertical near the bottom of the opening. Such bending has been observed to deflect the center of the opening bottom toward its neighbor by as much as 50% to 100% of the opening diameter. The foregoing problems of bowing and bending have only recently arisen, and coincide with the reduction in device feature size to 45 nm or below, and their cause has remained a mystery. No solution has appeared, although some reduction in bowing or bending has been achieved by reducing the plasma reactor chamber pressure during the plasma etch process and/or increasing RF bias power and ion energy. Such an approach, while reducing the bending or bowing of the etch profile, is problematic in that it reduces the range of chamber pressures (process "window") over which the plasma etch process may be performed. Similarly, increasing the ion energy by increasing the RF bias power applied to the wafer may have undesired effects upon the etch process, such as a decrease in etch selectivity, photoresist corner faceting, etc. What is needed is a way of preventing bowing and bending without constricting the process window.

SUMMARY

A method is provided for performing plasma ion etching of high aspect ratio contact openings in a dielectric layer on a substrate. In one embodiment, the method includes introducing into the plasma reactor chamber a fluorocarbon and/or fluorohydrocarbon gas such as $C_2F_4$, $C_4F_6$, $CH_2F_2$ or $C_4F_8$ at a first gas flow rate, silicon fluoride gas at a second flow rate that is within a factor between 0.5 and 1.5 of the first flow rate, and Argon gas at a flow rate that is a factor between about 2 and 7 times the first flow rate. The method further includes etching a contact opening in the dielectric layer while depositing a polymer film on a side wall of the contact opening having a film thickness less than the radius of the contact opening. In one embodiment, etching a contact opening in the dielectric layer while depositing a polymer film on a side wall of the contact opening is done by coupling RF power into the chamber to generate a plasma in the chamber while continuously applying RF bias power of a nominal RF bias power level corresponding to a desired plasma etch process. In one embodiment, the conductivity of the polymer film on the side wall is increased by using conductive polymer material and by ion bombardment of the polymer film with Argon ions, and by coupling to the substrate successive bursts of RF bias power of a high RF bias power level in excess of more than 1.5 times the nominal power level.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

Figure 1:
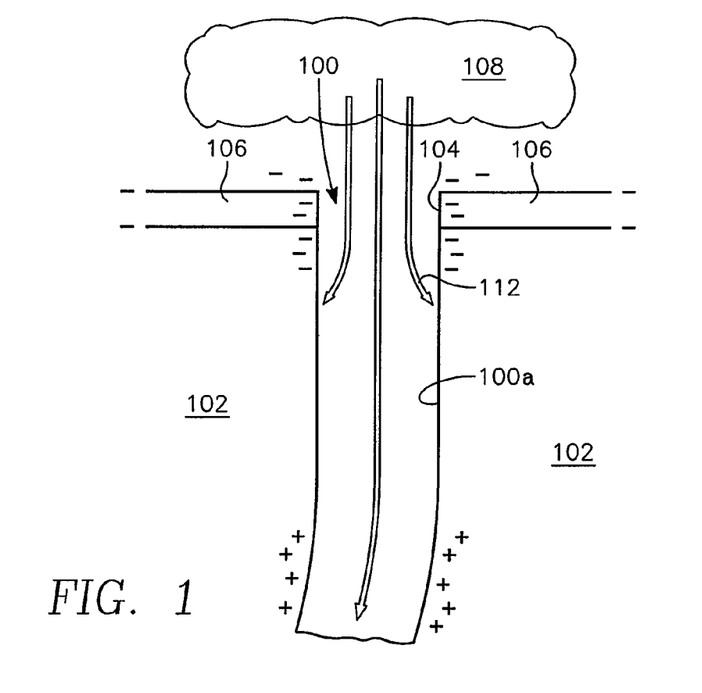
FIG. 1 depicts the effects of static charge accumulation in a high aspect ratio contact opening during the contact etch process.
Figure 2:
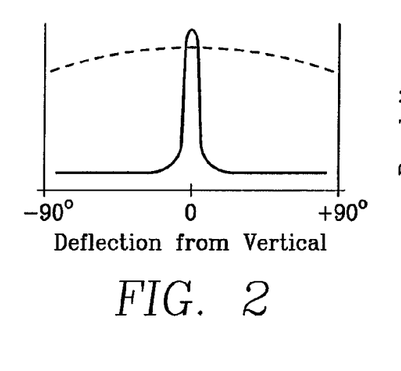
FIG. 2 is a graph illustrating the angular velocity distribution at the wafer surface of ion trajectories (solid line) and electron trajectories (dashed line).

We have discovered that the bending and bowing of the etch profile that occurs at feature sizes at and below 45 nm is caused by uneven static charge distribution along the length of the sidewall surface of each contact opening. The problem arises in part from the different angular distributions of ion and electron velocity profiles. As depicted in FIG. 1, a high aspect ratio contact opening 100 is formed in a dielectric film 102 in registration with an aperture 104 through an overlying photoresist layer 106. The opening 100 is formed by the reaction of the exposed portion of the dielectric film 102 with etchant species in a fluorocarbon/fluorohydrocarbon plasma 108. Both electrons and positively charged ions from the plasma encounter the sidewall 100a of the opening 100. As shown in the graph of FIG. 2, the ions have a narrow angular velocity distribution or profile (solid line) concentrated about the vertical direction relative to the top surface of the dielectric layer 102, while the electrons have a more isotropic angular velocity distribution. As a result, virtually no electrons from the plasma are able to travel to the bottom of the high aspect ratio opening 100 before being absorbed by collisions with the side wall 100a. Instead, nearly all the electrons are absorbed by collisions with the top portion of the side wall 100a, so that the top portion of the side wall 100a becomes negatively charged.

Figure 3:
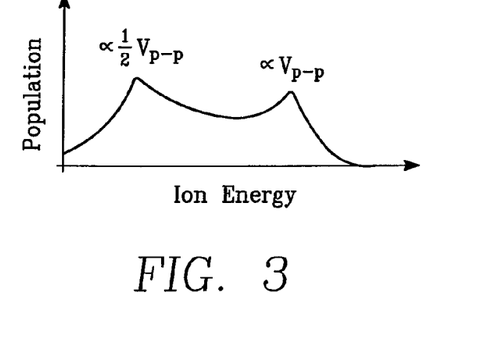
FIG. 3 is a graph of the ion energy distribution.
Figure 4:
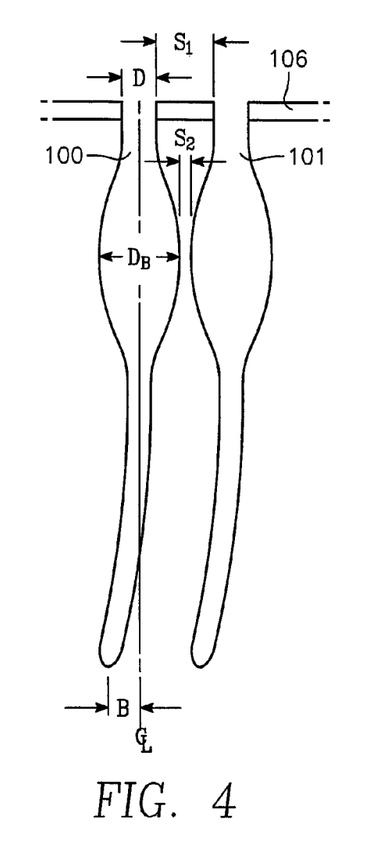
FIG. 4 depicts the resulting etch profile of high aspect ratio contact openings caused by the charge accumulation effects depicted in FIG. 1.

The ions have two energy peaks. A high energy peak occurs at an ion energy corresponding to the peak-to-peak voltage of the RF bias signal applied to the wafer. A lower energy peak occurs at an ion energy corresponding to one-half of the peak-to-peak bias voltage. The ion population distribution at the various kinetic energy levels is depicted in the graph of FIG. 3. The higher energy peak increases in population as the RF frequency of the bias signal decreases. The higher energy ions tend not to collide with the side wall 100a until they reach the bottom portion of the opening 100, so that the bottom portion of the side wall 100a becomes positively charged. The lower energy ions are more easily deflected from their vertical trajectory by negative charge that accumulates near the top of the side wall 100a. The deflected ion path 112 depicted in FIG. 1 represents a typical path of a lower energy ion which is deflected from true vertical as the ion travels in a curved path through the electric field of the negatively charged section of the side wall 100a, the deflected ion path eventually intersecting the side wall 100a at a point below the negatively charged section of the side wall 100a. This increases the etch rate of the side wall 102 at that point, leading to bowing of the opening profile in the region near the intersection of the deflected ion path and the side wall 100a. The result is depicted in FIG. 4, in which a high aspect ratio contact opening 100 having a nominal diameter D has a section near its top with an enlarged diameter $D_B$ representing the bowing of the etch profile. The contact opening 100 is separated from an adjacent contact opening 101 by a nominal separation distance $S_1$. In the vicinity of the bowing, the separation distance decreases to a small separation $S_2$, which may be as little as 5% of the nominal separation distance $S_1$. In some cases, the separation, $S_2$, may be zero in the vicinity of the bowing. The enlarged opening diameter $D_B$ may be nearly twice the nominal diameter D.

The bending problem arises because of uneven charge distribution around the circumference of the side wall 100a. This may be an uneven circumferential distribution of the positive charge that accumulates near the bottom of the opening 100, for example. Such uneven charge distribution produces a small net deflection of the higher energy ions that is not manifested until the ions have traveled a sufficiently long distance, or to the bottom of the opening 100. As a result, the bending problem appears as a lateral shift in the position of the center of the bottom of the opening 100 from the center (or axis) of the top of the opening 100. Referring to FIG. 4, the bottom of the opening 100 is laterally shifted by a bending distance B that is about equal to the diameter D of the opening.

Embodiments of the present invention pertain to solving both the bowing problem and the bending problem by providing, during the entire duration of the plasma etch process, a conductive thin film on the side wall 100a of each opening 100. The conductive coating constitutes an electrical discharge path along which uneven distribution of charge may flow so as to equilibrate the charge distribution. In effect, build-up of negative charge near the top of the opening 100 and positive charge near the bottom of the opening 100 is reduced or eliminated by the positive and negative charges flowing toward one another along the conductive thin film on the side wall 100a.

Figure 5:
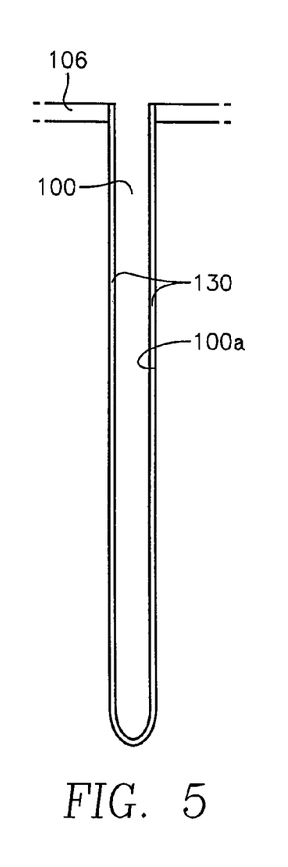
FIG. 5 illustrates a concept in accordance with an embodiment in which a conductive film covers the side walls of the high aspect ratio openings.
Figure 6:
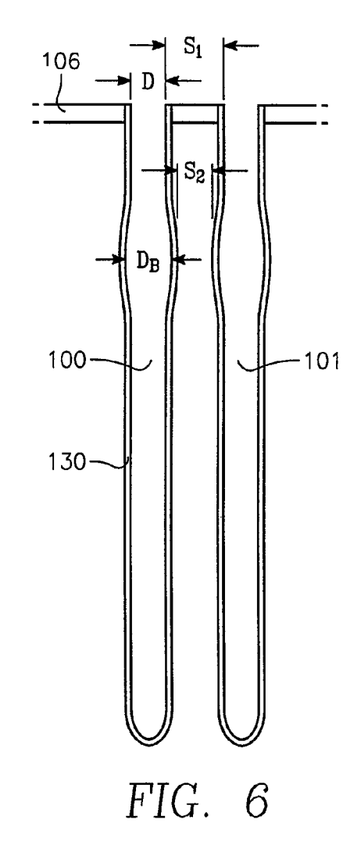
FIG. 6 depicts the final etch profile achieved in a plasma etch process of the type depicted in FIG. 5.

During the etch process, the depth of the opening 100 constantly increases, lengthening the depth of the side wall 100a. As the depth of the opening 100 increases during the etch process to constantly form an additional section of side wall 100a, the conductive thin film is extended downwardly to coat the additional section. In one embodiment, the process is carried on continually during the etch process. FIG. 5 depicts the beginning of a contact opening 100 near the start of the etch process, showing a conductive thin film 130 coating the side wall 100a. FIG. 6 depicts the results of this process after the contact opening 100 has reached its full depth, about 24,700 Å. The diameter $D_B$ at the bow is within 10% or less of the nominal diameter D. The bending distance B (the deflection of the opening axis at the bottom) has been reduced to nearly zero. These results were obtained by providing in the conductive film 130 a conductivity of at least 5 Seimens/meter. The conductivity should be sufficient to realize a 1/e discharge time in the conductive layer 130 of about $10^{-11}$ sec or less. The 1/e discharge time $T=\in/\sigma$, where $\in$ is the effective dielectric constant of a static electricity discharge path through conductive layer 130 and $\sigma$ is the electrical conductivity of the conductive layer 130.

Figure 7:
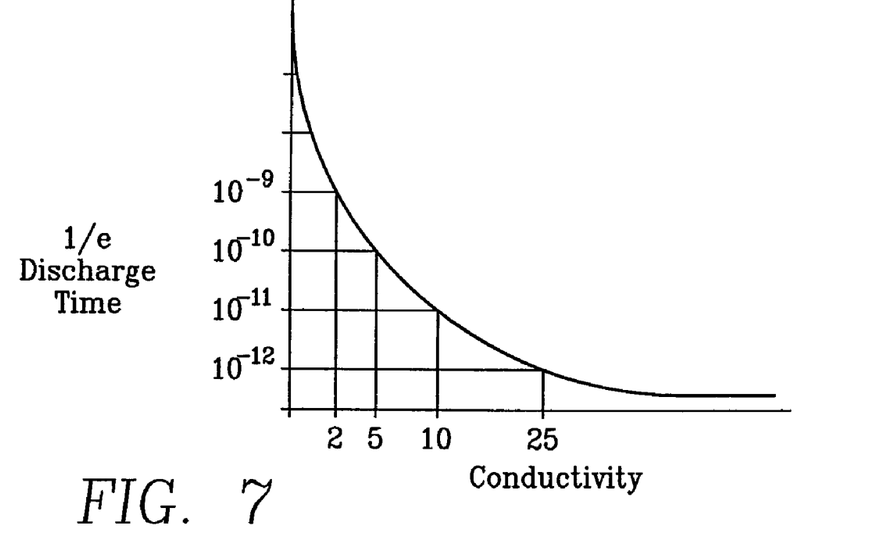
FIG. 7 depicts electrical discharge time as a function of conductivity in a partially conductive polymer film.
Figure 8A:
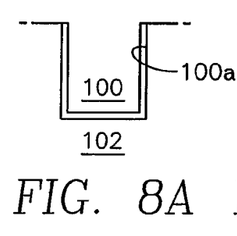
FIGS. 8A through 8H depict a chronological succession of etch profiles obtained during a plasma etch process in accordance with one embodiment.
Figure 8B:
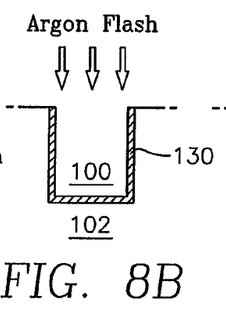
Figure 8C:
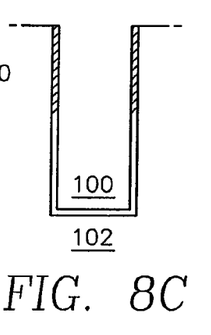
Figure 8D:
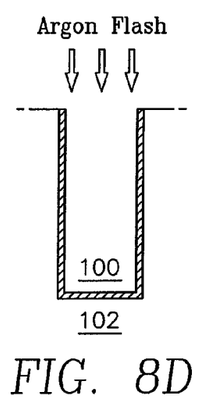
Figure 8E:
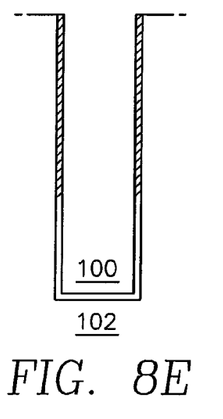
Figure 8F:
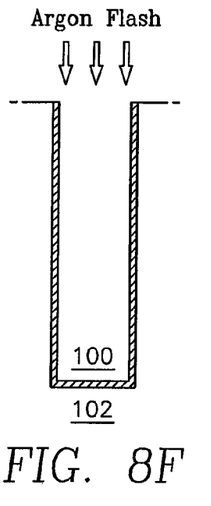
Figure 8G:
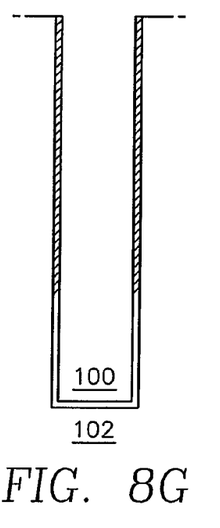
Figure 8H:
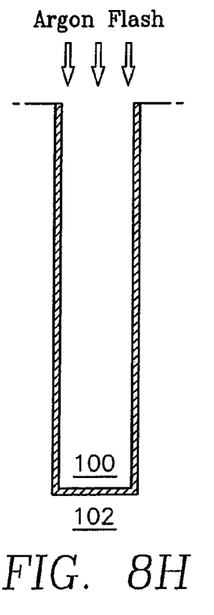

In one embodiment, the conductive thin film 130 is formed by employing a fluorocarbon and/or fluorohydrocarbon process gas of either $C_2F_4$, $C_4F_6$, $CH_2F_2$ or $C_4F_8$ during the plasma etch process. Fluorine-rich plasma by-products formed by dissociation of the fluorocarbon/fluorohydrocarbon gas molecules in the plasma etch the exposed portion of the dielectric material 102. Carbon-rich plasma by-products formed by dissociation of the fluorocarbon/fluorohydrocarbon gas molecules in the plasma tend to deposit on the side wall 100a as the thin conductive polymer layer 130 which is on the order of about 10 Å thick. The conductivity of the layer 130 is enhanced sufficiently to attain a 1/e discharge time on the order of $10^{-11}$ or less. FIG. 7 is a graph depicting the 1/e discharge time (vertical axis) as function of conductivity (horizontal axis) for a given dielectric constant that is typical of a fluorocarbon polymer of the type discussed above. In one embodiment, the conductive layer 130 is a specially formed polymer that has both dielectric and conductive properties, with a sufficient conductivity to minimize the 1/e discharge time to on the order of $10^{-11}$ sec or less. The effect of providing such conductivity in the layer 130 is to cause the positive and negative charges on the side wall 100a or (more accurately) in the layer 130 to flow toward one another and thereby neutralize or equilibrate. The result is a uniform distribution of static charge along the side wall 100a, or possibly a cancellation of static charge.

In one embodiment, a conductive polymer is formed by employing, for example, either $C_2F_4$, $C_4F_6$, $CH_2F_2$ or $C_4F_8$ as the process gas during the plasma etch process in which the contact opening 100 of FIG. 6 is formed. Either $C_2F_4$, $C_4F_6$, $CH_2F_2$ or $C_4F_8$ forms polymer precursors in the plasma that tend to form a conductive polymer when deposited on the side wall 100a as the conductive layer 130. In addition, the requisite conductivity is attained by adding a semiconductor species-containing process gas into the plasma, such as $SiF_4$ silicon fluoride. This causes the polymer layer 130 to include silicon atoms in the polymer structure, increasing the conductivity of the polymer layer 130.

In one embodiment, conductivity of the polymer layer 130 on the side wall 100a is further enhanced by adding a relatively high atomic number inert gas, such as Argon, into the plasma and ion bombarding the polymer layer 130 with high energy Argon ions. This is accomplished by applying a low frequency (1-4 MHz) RF bias signal to the wafer at a power level in a range of about 5-10 kilowatts. The result can be to transform the molecular structure of the polymer film 130 so that it becomes more like a graphite structure. The graphite structure is a planar hexagonal carbon crystal structure with high electrical conductivity. As the molecular structure of the polymer film 130 begins to resemble a graphite structure, the conductivity of the polymer film 130 will begin to approach the conductivity of graphite. In one embodiment, Argon ion bombardment is carried out at a sufficient ion energy to attain a conductivity of about 5 S/m in the polymer layer 130.

Figure 9:
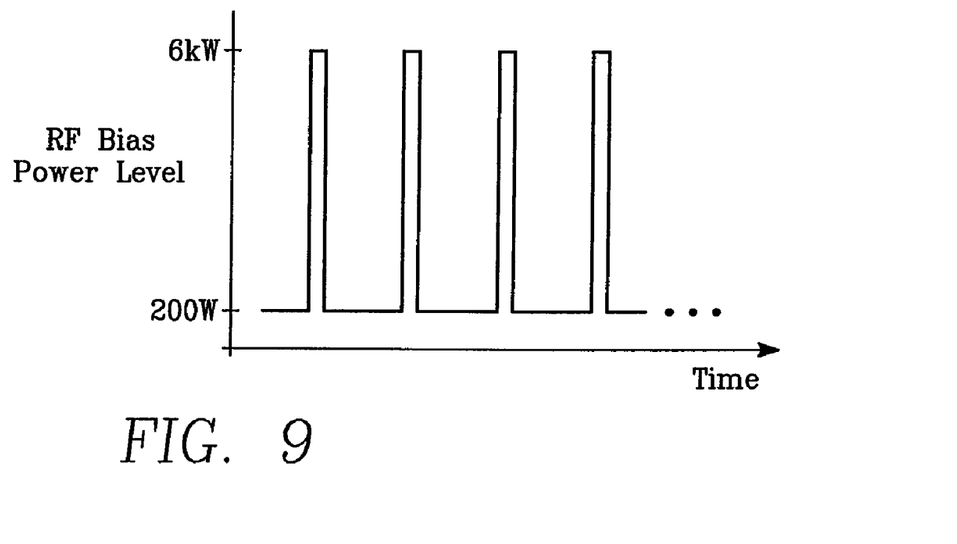
FIG. 9 depicts the applied RF bias power level as a function of time in the process of FIG. 8.

The high power high voltage RF bias required for the Argon ion bombardment may be incompatible with some dielectric etch process recipes. In such instances, the Argon ion bombardment is performed periodically in short bursts/flashes so as to have less effect on the plasma etch process, leaving the RF bias power at a lower level that is compatible with the etch process recipe, except during each short burst when high energy Argon ion bombardment is performed. This concept is depicted in FIGS. 8A through 8H, which are a chronological succession of etch profile images depicting the progressive etching of a contact opening. In FIGS. 8A through 8H, only the portion of the conductive layer that has been previously exposed to high energy Argon ion bombardment is shaded, the unshaded portion representing a new portion of the conductive layer 130 formed since the previous ion bombardment burst and therefore not yet exposed to ion bombardment. In FIGS. 8A, 8C, 8E, 8G, a new section of side wall 100a and new section of polymer film 130 (unshaded) has been formed in the interim between successive bursts so that it has not yet been exposed to a high bias power. In FIGS. 8B, 8D, 8F, 8H, during the next burst of high RF bias power (e.g., 6 kW), the previously unexposed (unshaded) portion of the conductive layer 130 is exposed to a short burst of high bias voltage and high energy Argon ion bombardment to transform its structure to a more conductive one, this transformation being denoted by the shading of the layer 130 in the drawing. The corresponding pattern of RF bias power applied to the wafer over time is depicted in FIG. 9, showing that the RF bias power remains at a nominal power level called for by the etch process recipe (e.g., 3 kilowatts or in a range of 500 Watts to 4 kilowatts), except for short periodic bursts, during which the power is temporarily raised to a high level (e.g., 6 kilowatts). In one embodiment, the RF power level may be pulsed in bursts, as depicted in FIG. 9, but the Argon gas flow rate may be constant. Fluorocarbon or fluorohydrocarbon process gases are used during nominal etch, while Ar only during Ar bursts. The duration of each burst is sufficient to attain the required increase in electrical conductivity in the newly exposed portion of the polymer film 130, and may be on the order of 10 millisecond (e.g., in a range of about 0.25 ms to 1 sec or more). The greater the difference between the nominal etch process bias power level and the ion bombardment burst power level, the shorter should be the duration of the burst to avoid affecting the etch process. For example, the difference may be relatively high in the case of a nominal etch process bias power level (e.g., 500 W) and an ion bombardment burst of 6 kW, in which case the duration of each 6 kW burst should be relatively short, e.g., about 1 ms. For a higher nominal etch process bias power level (e.g., 3 kW) and a burst bias level of 6 kW, the difference is less, and therefore the burst duration may be increased above 10 ms to on the order of 1 second, for example. The time between bursts is sufficiently short to prevent significant charge build-up in the new (unshaded) portion of the polymer film 130 not yet exposed to the high energy ion bombardment, and may be on the order of one second (e.g., 0.5 seconds to 5 seconds).

In one embodiment, the RF bias signal frequency is an LF frequency in the range of 1-4 MHz, for example. In addition, a 13.56 MHz RF bias power component may also be applied to the wafer. The chamber pressure has a wider range than in conventional processes, and may be set anywhere between 10 mT and 1 Torr. The bowing and bending problem is reduced or eliminated by charge neutralization (or equilibration) through the conductive layer 130, so that some increase in angular deflection of ion trajectory from the vertical direction (due to an increase in chamber pressure) may be tolerated. The density of the plasma is controlled by coupling RF plasma source power into the chamber from an RF source power applicator, which may be an inductive coil or an overhead capacitive electrode.

Figure 10:
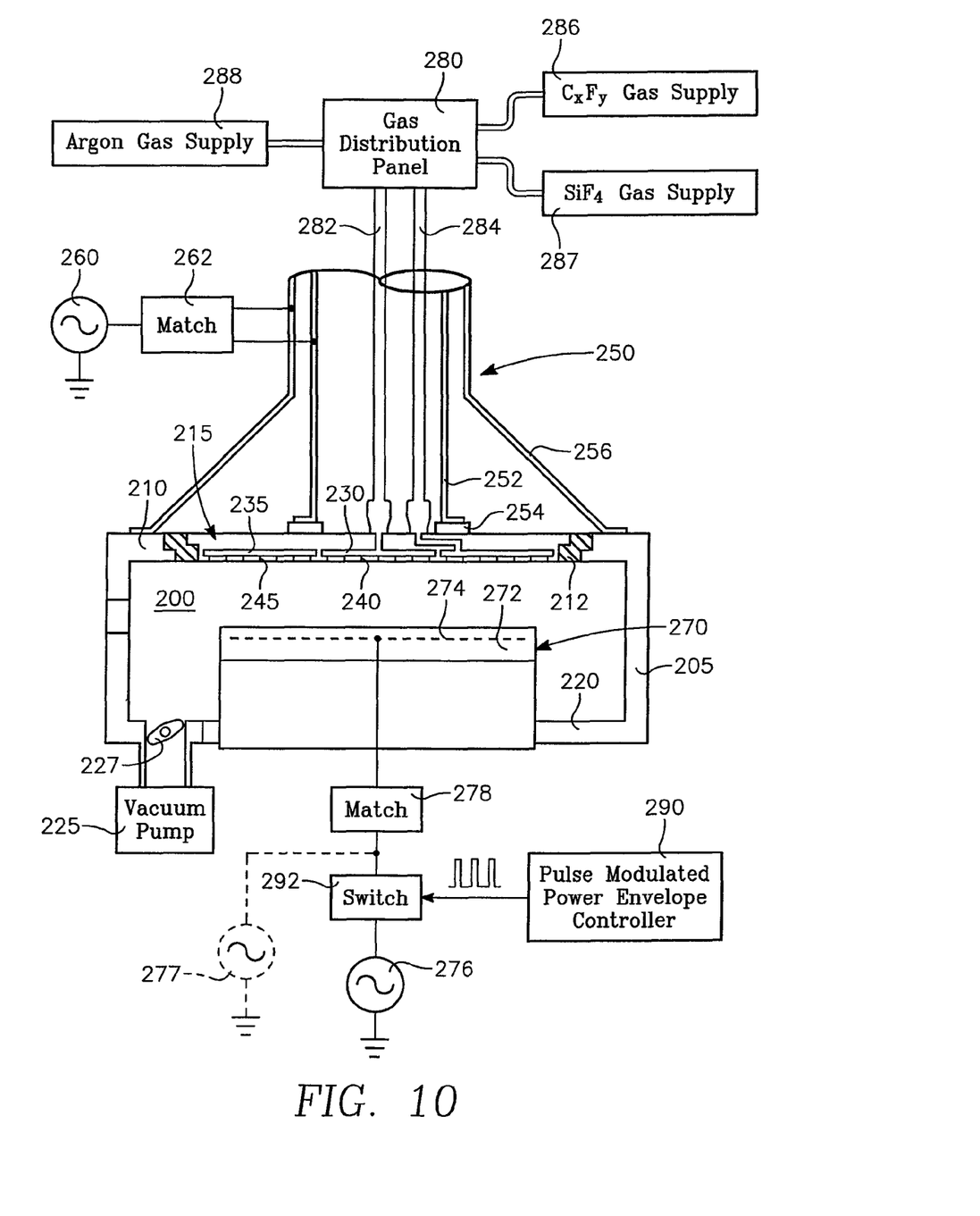
FIG. 10 depicts a plasma reactor configured to carry out the etch process of FIG. 5.

A plasma reactor adapted to carry out the foregoing process is depicted in FIG. 10. The reactor includes a vacuum chamber 200 enclosed by a cylindrical side wall 205, a ceiling 210, an overhead electrode 215 in an aperture of the ceiling 210, and a floor 220. An insulating ring 212 separates the electrode 215 from the ceiling 210. A vacuum pump 225 is coupled to the chamber 200 through a pumping port 227 in the floor 220. The overhead electrode 215 is a gas distribution plate having inner and outer interior gas manifolds 230, 235 that feed inner and outer arrays of gas injection orifices 240, 245. A coaxial RF feed structure 250 couples RF plasma source power to the overhead electrode 215, the feed structure 250 including an inner hollow cylindrical conductor 252 coupled to the electrode 215 through a thin insulating ring 254, and an outer hollow cylindrical conductor 256 terminated at the ceiling 210. An RF source power generator 260 is coupled to the inner and outer coaxial conductors 252, 256 through a fixed impedance match element 262 which may be a coaxial tuning stub. A wafer support pedestal 270 includes an insulating layer 272 enclosing a cathode electrode 274 that is coupled to an RF bias power generator 276 through an impedance match element 278. A process gas distribution panel 280 supplies process gas to the inner and outer manifolds 230, 235 through gas supply lines 282, 284. Various gas supplies are coupled to the gas distribution panel, including a fluorocarbon/fluorohydrocarbon gas supply 286, a silicon fluoride gas supply 287 and an Argon gas supply 288. The gas distribution panel 280 determines the flow rates of the individual gases that constitute the total gas flow rate in the gas supply lines 282, 284. In one embodiment, a pulse modulated power envelope controller 290 enables the generator 276 to apply high power bursts (e.g., 6 kW) while maintaining a nominal power output level (e.g., 3 kW) between bursts. In another embodiment, the controller 290 may control a switch 292 at the output of the generator 276. A second generator 277 (shown in dashed line) supplies the constant nominal (e.g., 3 kilowatt) power output, while the generator 276 supplies the periodic short 6 kW bursts that are gated by the switch 292.

The duration of each of the periodic high power bursts is sufficiently short to minimize impact on the etch process recipe, but is sufficiently long to obtain an increase in conductivity of the polymer film 130 of FIG. 5. The time between bursts is sufficiently short to prevent significant static charge build-up on the contact opening side wall 100a of FIG. 8. During the time between bursts, newly formed portions of the polymer layer 130 of FIG. 8 have not been exposed to ion bombardment and therefore have a lower conductivity, thereby rendering the new portions susceptible to charge accumulation. This accumulation can be minimized (to avoid bowing or bending of the etch profile) by minimizing the time between bursts of high power RF bias on the wafer. The duration of each high power RF bias burst may be, for example, about 10 ms, and the time between bursts may be about 1 sec. The fluorocarbon/fluorohydrocarbon process gas flow rate may be in the range of 10-100 sccm to the combination of the inner and outer gas manifolds 230, 235. The Argon flow rate is about 2 to 7 times the fluorocarbon/fluorohydrocarbon gas flow rate. The silicon fluoride flow rate is between about 0.5 and 1.5 times the flow rate of the fluorocarbon/fluorohydrocarbon process gas. The nominal bias power level may be about 500-4000 Watts while the RF burst level may be in the range of about 5-10 kilowatts. The bias power frequency may be in the range of 1-4 MHz. The chamber pressure may be in the range of 1 mT to 10 Torr, for example. In one embodiment, the fluorocarbon process gas may be $C_2F_4$.

Figure 11:
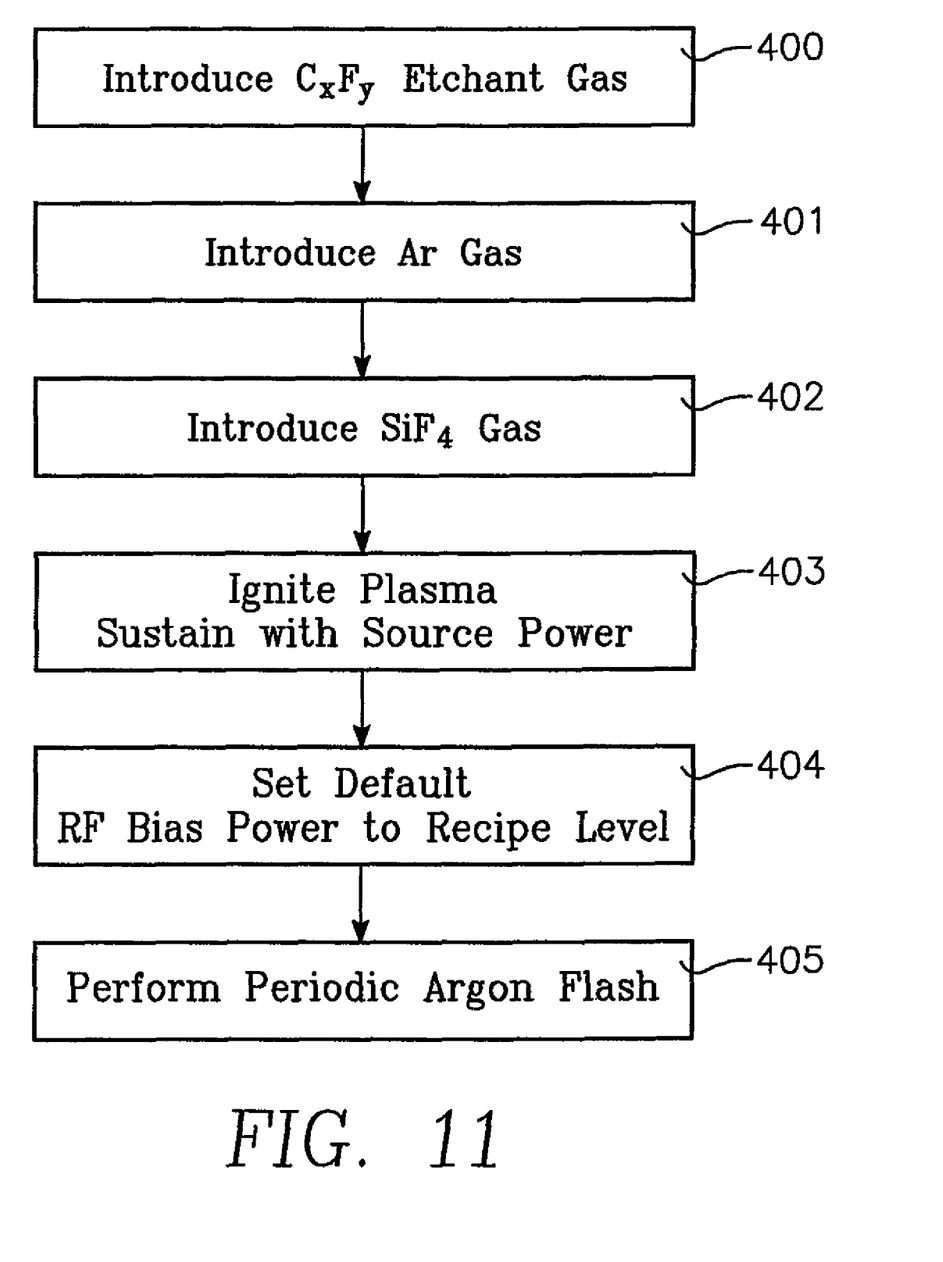
FIG. 11 is a flow chart corresponding to a process in accordance with one embodiment.

FIG. 11 illustrates a process in accordance with one embodiment. In the process, a fluorocarbon/fluorohydrocarbon gas (e.g., $C_2F_4$, $C_4F_6$, $CH_2F_2$ or $C_4F_8$) is introduced into the chamber at a flow rate in a range of 10-100 sccm (block 400). In addition, Ar gas is introduced (block 401) at a flow rate (e.g., 300-750 sccm) between 2 and 7 times the fluorocarbon/fluorohydrocarbon gas flow rate and silicon fluoride gas is introduced at a flow rate (e.g., 10-100 sccm) between 0.5 and 1.5 times the flow rate of the fluorocarbon/fluorohydrocarbon gas (block 402). RF source power is applied and RF bias power is applied to ignite a plasma in the chamber. The RF bias power level is set to a nominal level called for by an etch process recipe, for example 500-4000 Watts, at which acceptable etch selectivity and minimal photoresist faceting or damage is experienced. In order to optimize conductivity of the polymer film 130 of FIG. 8, the bias power is periodically increased to about 6 kW for a brief period of time (e.g., 10 msec) with Ar flow only at a predetermined rate (e.g., once every second). This is carried out until the contact opening has been etched to the desired depth.

While the foregoing is directed to embodiments of the invention, other and further embodiments of the invention may be devised without departing from the basic scope thereof, and the scope thereof is determined by the claims that follow.

What is claimed is:

1. A method of performing plasma ion etching to form a high aspect ratio contact opening in a dielectric layer on a substrate, said method comprising:
    forming an aperture in a photoresist layer overlying the dielectric layer, said aperture defining a contact opening location and diameter;
    placing the substrate in a plasma reactor chamber;
    introducing into the chamber: a fluorocarbon or fluorohydrocarbon gas and Argon gas;
    etching a contact opening in said dielectric layer in registration with said aperture while depositing a polymer film on a side wall of said contact opening by coupling RF power into said chamber while continuously coupling to said substrate RF bias power of a nominal RF bias power level corresponding to a desired plasma etch process;
    and
    increasing conductivity of said polymer film on said side wall by ion bombardment of said polymer film with Argon ions, comprising coupling to said substrate successive bursts of RF bias power of a high RF bias power level in excess of more than 1.5 times said nominal power level.

2. The method of claim 1 wherein said nominal RF bias power level corresponds to a desired etch profile and said high RF bias power is sufficient to transform the molecular structure of said polymer film to a more electrically conductive structure.

3. The method of claim 2 wherein said nominal RF bias power level is on the order of several hundreds to a several thousands of Watts and said high RF bias power level is several kiloWatts.

4. The method of claim 3 wherein said bursts of RF bias power have a duration on the order of milliseconds to one second and a time-between-bursts on the order of one or more seconds.

5. The method of claim 1 wherein said high RF bias power level is sufficient to produce an electrical conductivity in said polymer film of at least 5 S/m.

6. The method of claim 1 wherein said high RF bias power level is sufficient to achieve a 1/e electrical discharge time in said polymer film on the order of $10^{-11}$ second or less.

7. A method of performing plasma ion etching to form high aspect ratio contact openings in a dielectric layer on a substrate, said method comprising:
    etching a contact opening in a dielectric layer on a substrate while depositing a polymer film on a side wall of said contact opening by introducing into a chamber containing said substrate a fluorocarbon or fluorohydrocarbon gas at a first gas flow rate and coupling RF power into said chamber while continuously applying etch RF bias power to the substrate of a nominal power level; and
    increasing the conductivity of said polymer film on said side wall by ion bombardment of said polymer film, wherein said ion bombardment of said polymer film comprises introducing Argon gas at a second gas flow rate into the chamber and applying ion bombardment RF bias power to the substrate in a succession of bursts on the order of at least one kiloWatt.

8. The method of claim 7 wherein said high power level is on the order of at least 1.5 times said nominal power level one.

9. The method of claim 7 further comprising introducing into the chamber a process gas containing a semiconductor element at a third gas flow rate.

10. The method of claim 9 wherein said process gas containing a semiconductor element comprises a fluoride of a semiconductor element.

11. The method of claim 9 wherein said third gas flow rate is between 0.5 and 1.5 times said first gas flow rate.

12. The method of claim 7 wherein said second gas flow rate is in the range of 2 to 7 times said first gas flow rate.

13. The method of claim 8 wherein said bursts have a duration less than the time between bursts.

14. The method of claim 7 wherein:
said continuously applying etch RF bias power comprises supplying said etch bias power from a first RF generator; and
said applying ion bombardment bias power comprises supplying said ion bombardment bias power from a second RF generator through a gated switch.

15. The method of claim 7 wherein said fluorocarbon/fluorohydrocarbon gas comprises at least one of $C_2F_4$, $C_4F_6$, $CH_2F_2$ or $C_4F_8$.

16. A method of processing a workpiece, said method comprising:
placing the workpiece in a plasma reactor chamber;
introducing into the chamber a fluorocarbon or fluorohydrocarbon gas;
coupling RF power into said chamber while continuously applying RF bias power of a nominal RF bias power level corresponding to a desired plasma etch process to said workpiece; and
coupling to said workpiece successive bursts of RF bias power of a high RF bias power level in excess of more than 1.5 times said nominal power level.

17. The method of claim 16 wherein said nominal RF bias power level is on the order of several hundreds to several thousands of Watts and said high RF bias power level is several kiloWatts and said successive bursts are of a duration shorter than a time between bursts.

18. The method of claim 16 further comprising introducing into the chamber a process gas containing a semiconductor element at a third gas flow rate.

19. The method of claim 16 further comprising introducing Argon gas into said chamber.

* * * * *